United States Patent [19]

Kurtz et al.

[11] 4,385,271
[45] May 24, 1983

[54] FAULT MONITORING BY DETECTING A POLARITY DIFFERENCE

[76] Inventors: Moshe Kurtz, 35 Cavotti Crescent, Downsview, Ontario, Canada, M3H 4V3; Gregory C. Stone, 25 Holloway Rd., Islington, Ontario, Canada, M9H 1E9

[21] Appl. No.: 245,656

[22] Filed: Mar. 20, 1981

[51] Int. Cl.³ ............................................. G01R 31/02
[52] U.S. Cl. ......................................... 324/51; 324/52; 324/133
[58] Field of Search ................ 340/651; 361/110, 111; 324/51, 52, 133

[56] References Cited

U.S. PATENT DOCUMENTS

| | | | |
|---|---|---|---|
| 3,176,285 | 3/1965 | Neeman | 340/651 X |
| 3,746,981 | 6/1973 | Stone | 324/51 X |
| 3,931,502 | 1/1976 | Kohlas | 324/52 X |
| 4,362,986 | 12/1982 | Burke | 324/51 |

FOREIGN PATENT DOCUMENTS

| | | | |
|---|---|---|---|
| 795922 | 10/1968 | Canada | 324/51 |
| 2387 | 6/1979 | European Pat. Off. | 324/51 |

Primary Examiner—Stanley T. Krawczewicz
Assistant Examiner—Jose M. Solis
Attorney, Agent, or Firm—Ridout & Maybee

[57] ABSTRACT

In a system for continuously monitoring partial discharge in high voltage electrical equipment thereby to give advance warning of impending breakdown of solid-insulated components, means are provided to distinguish electrical signals indicative of partial discharge from those resulting from noise or external transients. Current pulses in the various partial discharge paths are detected, and by solid-state circuitry their relative polarities are compared and an appropriate signal is made according to the comparison.

13 Claims, 7 Drawing Figures

FAULT MONITORING BY DETECTING A POLARITY DIFFERENCE

This invention relates to a system for continuously monitoring partial discharge activity in high voltage electrical equipment, such as substation equipment for example, whereby to provide advance warning of an impending failure of solid-insulated apparatus, permitting timely corrective action.

In high voltage substation equipment, for example, the solid insulation of such components as power transformers, capacitors, circuit breakers and insulating support columns may fail particularly in the case of outdoor equipment exposed to extreme weather conditions. Such failure is not common, but when it occurs it is catastrophic, presenting a serious hazard to personnel and equipment. Precautions must be taken to anticipate such failure and remove faulty apparatus before it occurs.

In principle it should be a straightforward matter to anticipate electrical breakdown in solid-insulated apparatus by monitoring partial discharge activity in the solid insulation and taking corrective action when the activity reaches a certain level. Indeed, various techniques have been proposed in the past for this purpose. However, the prior proposals have been unsuccessful for a variety of reasons. In the first place they have been quite uneconomic or have been impractical to install for continuous monitoring and therefore unreliable. In the second place they have been very susceptible to electrical interference and so liable to give false indications.

The present invention overcomes these drawbacks by providing a system whereby each selected component of the equipment may be individually and continuously monitored, and wherein signals indicative of component failure are readily distinguishable from noise and signals indicative of voltage transients.

According to one aspect of the invention there is provided a method of continuously monitoring partial discharge in high voltage electrical equipment providing a plurality of partial discharge current paths, which comprises detecting current pulses in each of said paths, determining the relative polarities of the detected current pulses, comparing the polarity of each detected current pulse with the remainder, identifying the respective partial discharge current path in the event of a discrepancy in such comparison and signalling the discrepancy.

According to another aspect of the invention there is provided a fault anticipation system for monitoring partial discharge in high voltage electrical equipment providing a plurality of partial discharge paths wherein a detected current pulse may be indicative of partial discharge or a voltage transient, the system comprising a plurality of discharge detection units each including circuit means coupled to a respective one of said paths, said circuit means including a polarity detector responsive to the polarity of a detected current pulse and a multiplexer coupled thereto for producing an output signal coded according to the detected polarity, a plurality of demultiplexers each connected to a respective one of said multiplexers to receive the coded output signal therefrom, each demultiplexer having a first and a second channel which are activated selectively according to the coding of the received output signal, latching means having a plurality of latch inputs coupled to said demultiplexer channels for receiving and storing a pattern of signals corresponding to the selective activation of said demultiplexer channels, a decoding circuit coupled to said latching means for decoding the stored pattern of signals thereby to identify the pattern of polarities of detected current pulses, and signalling means responsive to said decoding circuit for signalling a condition in which the polarity of a current pulse detected in one said partial discharge path differs from the polarities of current pulses detected in other said partial discharge paths.

It may be mentioned that U.S. Pat. No. 3,882,380 dated May 6, 1975 and assigned to F. C. Robinson and Partners Limited describes a system which has some similarity to the present system although there are fundamental differences. The prior patent describes an apparatus for testing electrical components for partial discharges under high voltage test conditions, the apparatus being adapted to identify pulses due to partial discharges so as to distinguish them from external transients or noise and so avoid false indications. Essentially the performance of a component under test is compared with that of a reference component. Two monitoring units are employed, each component being connected in circuit with a respective monitoring unit, and the outputs of the monitoring units are compared to determine whether a predetermined polarity relationship between them indicative of a partial discharge in the test component has been satisfied. This system, being essentially a "one-out-of-two" system, is not applicable to the monitoring of equipment having more than two components to be continuously monitored, as in a transformer substation. Nor can it be used as a permanent installation for the continuous monitoring of operative equipment.

In contrast, the apparatus of the present invention is specifically adapted for the continuous monitoring of high voltage equipment having a number of components to be monitored for the specific purpose of anticipating faults during operational performance of the equipment. Moreover, because the apparatus may be used to monitor any number of partial discharge paths, instead of being simply a "one-out-of-two" system, its operational reliability is greatly increased.

In order that the invention may be readily understood, one such apparatus will now be described, by way of example, with reference to the accompanying drawings, in which.

Figure 1:
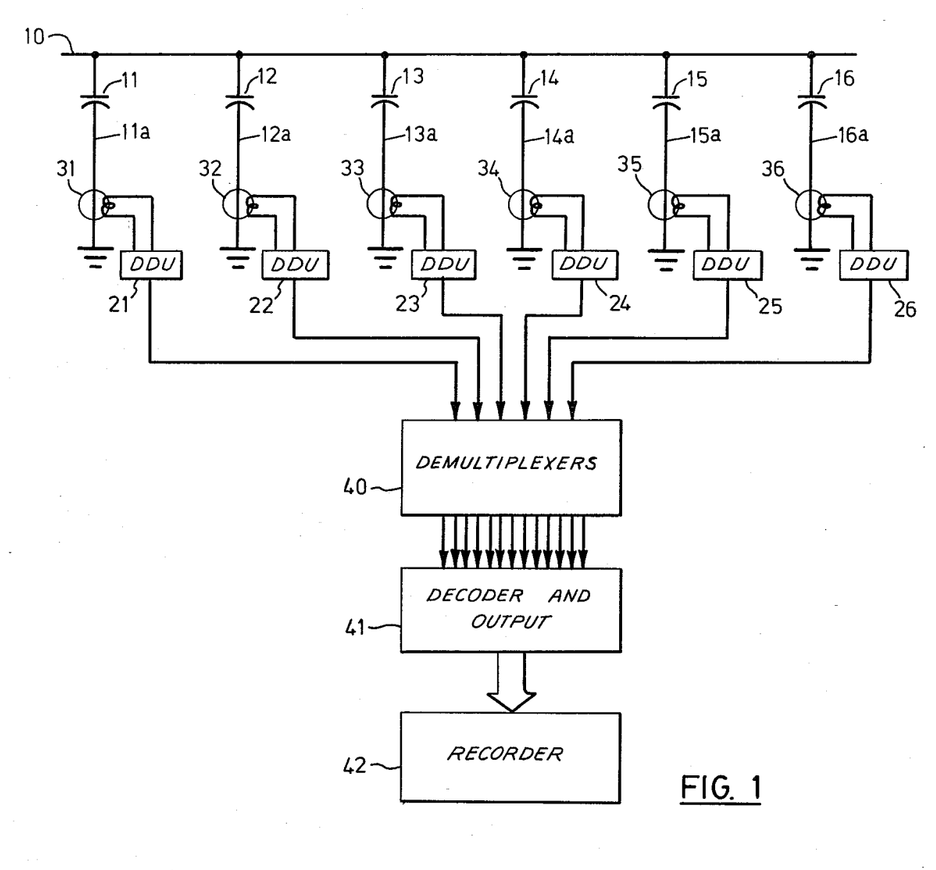
FIG. 1 is a schematic block diagram of the apparatus as installed for monitoring high voltage substation equipment.

The substation equipment is represented in FIG. 1 by a high voltage bus 10, to which are normally connected a number of solid-insulated components such as current transformers, capacitors, circuit breakers, support columns etc. The solid insulation of these components is represented in the figure by capacitors 11, 12, 13, 14, 15 and 16. In effect each such capacitor has a first electrode connected to the bus 10, and a second electrode connected to ground or a low potential conductor. The connections to ground, 11a–16a, define with the capacitors a number of discrete partial discharge paths. Under normal conditions, of course, no current flows along these paths other than charging current at mains frequency. In the event of a partial discharge in one of the solid insulators, however, a current pulse results in the associated discharge path. This pulse is detected by means of a discharge detection unit which is inductively coupled to the discharge path by a high frequency current transformer, the latter being wound on a split ferrite core. In the system shown in FIG. 1, wherein six components are being monitored, there are six such discharge detection units 21, 22, 23, 24, 25 and 26 which are respectively coupled inductively to the discharge paths by the six current transformers 31, 32, 33, 34, 35 and 36.

However, an individual discharge detection unit has no way of knowing whether a detected current pulse is due to a partial discharge or a voltage transient or noise on the bus. According to the present invention this determination is made by noting the polarity of a detected current pulse and comparing this with the polarities of the other current pulses which are detected simultaneously. Thus, since the partial discharge paths form a network the occurrence of a current pulse in any one path will generally be accompanied by simultaneously occurring pulses in the other paths, the relative polarities of the pulses depending upon whether the source of disturbance is in the network or external to it. For example, a partial discharge in component 11 will give rise to a current pulse in the discharge path 11a, to be detected by the unit 21, and this will be accompanied by simultaneously occurring pulses of opposite polarity in each of the remaining paths 12a–16a. On the other hand, a voltage transient or other disturbance on the bus 11 will also give rise to a current pulse in the discharge path 11a, but this will be accompanied by simultaneously occurring pulses of the same polarity in each of the remaining paths.

In order to discriminate between these two conditions, each of the discharge detection units 21–26 produces an output pulse in pulse width modulated format corresponding to the detected polarity. The output pulses are demultiplexed by demultiplexers 40, resulting in a pattern of signals which are coded according to the detected condition. The coded pattern of pulses is stored in latches in block 41, decoded and used to activate appropriate indicators to signal, in the event that one of the pulses has a unique polarity indicative of a partial discharge, which of the components 11–16 was the source of the partial discharge.

In a preferred embodiment of the invention the decoded output of the unit 41 is also applied to a recorder 42, which maintains a continuous record of the performance of the insulative components being monitored and prints out a time mark periodically. In this way performance trends can be observed and trends which are known from experience to presage component failure can readily be identified.

Figure 2:
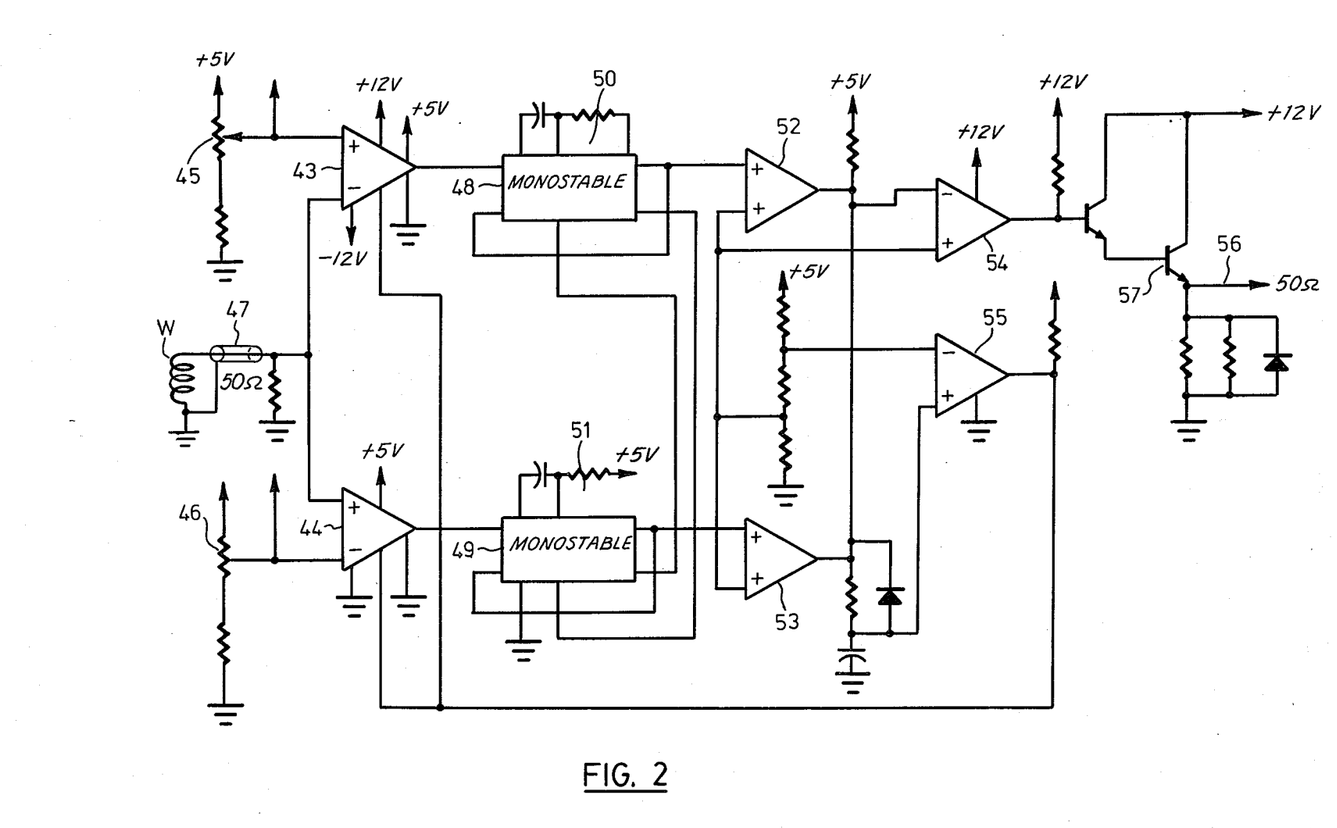
FIG. 2 is a circuit diagram of a discharge detection unit.

Referring now to FIG. 2, each discharge detection unit 21–26 comprises a pair of operational amplifiers 43, 44 connected as a dual polarity comparator and having a common input circuit connected to receive a detected current pulse from the assigned partial discharge path. The input circuit includes a pair of potentiometers 45, 46 for presetting the operating levels of the amplifiers, and is connected to the secondary winding W of the associated current transformer 31–36 by a 50 ohm coaxial cable 47. The outputs of the operational amplifiers 43, 44 are connected to respective monostable multivibrators 48, 49 having timing circuits 50, 51 which are set to provide different time constants. The multivibrator 48, on being triggered by an output from the amplifier 43 in response to a detected pulse of a first polarity, produces an output pulse of 10 microseconds duration. Similarly, the multivibrator 49, on being triggered by an output from the amplifier 44 in response to a detected pulse of opposite polarity, produces an output pulse of 20 microseconds connection. Each multivibrator 50, 51 has a Reset input R connected to an output 2 of the other multivibrator so that it remains inhibited during triggering of the latter. This prevents retriggering of the discharge detection unit due to ringing of an input pulse.

The output of the monostable multivibrators, via amplifiers 52, 53 is thus multiplexed and applied to interface circuitry including a pair of amplifiers 54, 55 which shift the operating voltage level from 5 volts to 12 volts. The multiplexed output is applied to a demultiplexing circuit of the following stage via a 50 ohm coaxial cable 56 driven by output transistor 57. The amplifiers 52, 53, 54 and 55 together with their associated circuitry also serve to prevent the unit from retriggering for a period of about 50 microseconds, so as to provide sufficient time for arrival and decoding of all signals in the subsequent stages.

Figures 3, 5:
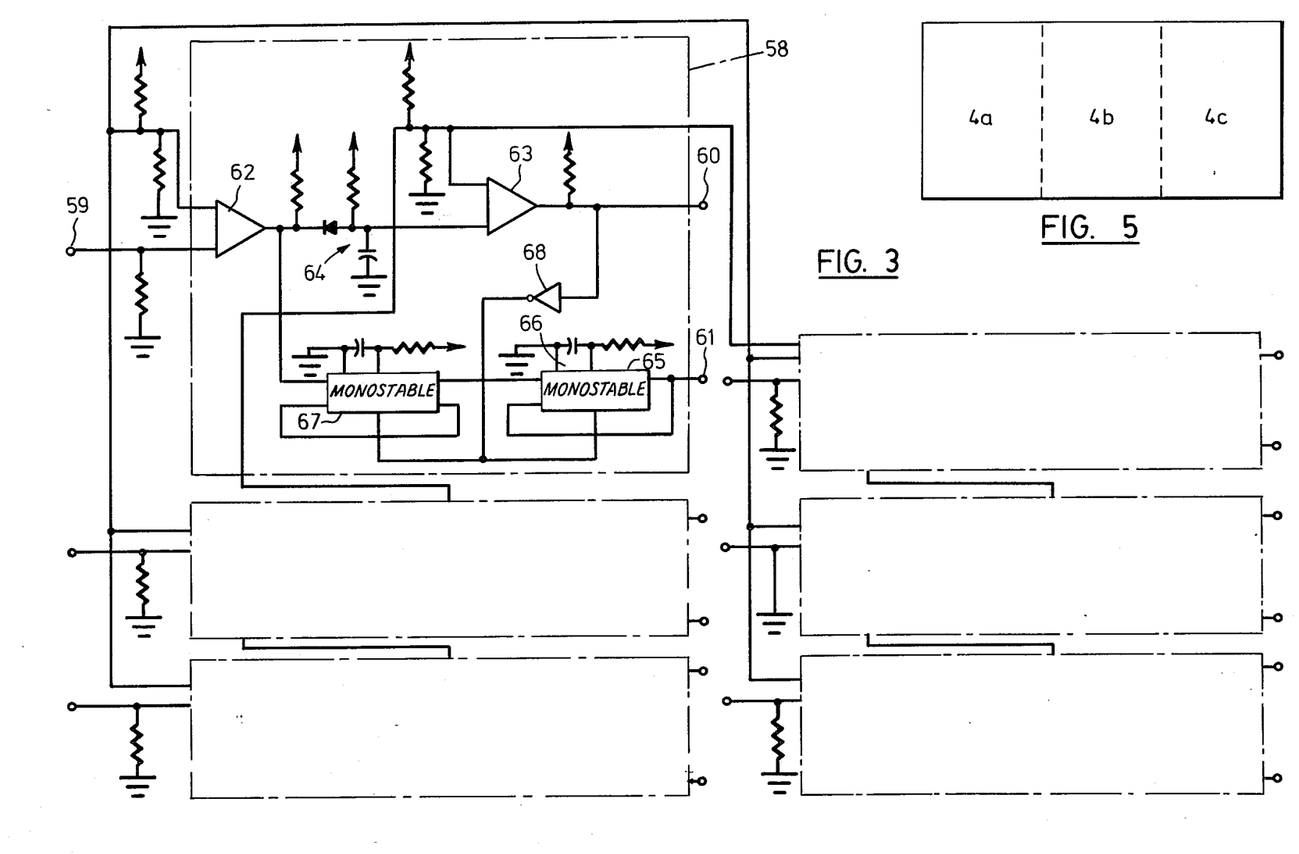
FIG. 3 is a circuit diagram of a demultiplexer system for demultiplexing the outputs of the discharge detection units.
FIG. 5 is a schematic diagram showing the interrelationship of FIGS. 4a, 4b and 4c.

The demultiplexer system consists of a number of similar units, one for each discharge detection unit. FIG. 3 shows six such units, but only the wiring of the first demultiplexer is shown as this is the same for all six blocks.

In the case of the first demultiplexer, block 58 the multiplexed signal from the preceding discharge detection unit is received over the coaxial cable 56 at input terminal 59. The demultiplexer also provides a pair of output terminals 60, 61. As will now be described, the demultiplexer includes discriminating circuitry providing in effect two channels connected respectively to the output terminals, the channels being activated selectively in response to an input pulse of 10 microseconds duration or an input pulse of 20 microseconds duration to produce an output pulse at terminal 60 or terminal 61 as the case may be.

For this purpose the input pulse on terminal 59 is applied to a comparator 62, the output of which is normally grounded in the absence of an input pulse. The output of the comparator 62 is connected to the input of a second comparator 63 through a time delay network 64 consisting of a CR charging circuit and diode. The output of the comparator 62 is also connected to a negative-edge triggered monostable multivibrator 65 having a timing circuit 66 through a time delay network which includes a positive-edge triggered multivibrator 67. The output of the second comparator 63 is connected both to the output terminal 60 and to the reset inputs of the monostable multivibrators 65, 67 through an inverter 68. The time constants of the respective timing circuits are such that, when an input pulse appears on input terminal 59, an output pulse will appear on either terminal 60 or terminal 61 depending on the duration of the input pulse. Thus, an input pulse on terminal 59 will cause the output of comparator 62 to go high and the time delay networks 64 and 67 will begin to charge. If the input pulse is of 20 microseconds duration, the diode of time delay network 64 will become charged permitting an output from comparator 63 and therefore an output signal on terminal 60. At the same time the monostable multivibrators 65 and 67 will be reset and no output will appear on terminal 61. On the other hand, if the input pulse is only of 10 microseconds duration the diode of time delay network will block the input to comparator 63 for the duration of the input pulse while the multivibrator 66 will be triggered after a certain delay to produce an output on terminal 61.

The twelve output terminals 60, 61 etc. of the demultiplexer section (FIG. 3) are connected to respective inputs 70 of an assembly of solid state latches 71, 72, 73 and 74 (FIG. 4a) which store the pulses received from the demultiplexers.

The contents of the latches thus represent a coded pattern of signals defining the pattern of detected current pulse polarities and identifying, in a case where one of the detected polarities is different from the rest, the particular component in which a partial discharge has taken place. The latch outputs are multiplexed by multiplexers 75, 76, 77 and applied to the inputs of two one-out-of-sixteen decoders 78, 79. These decoders identify which, if any, of the detected polarities is different from the rest. The decoded outputs are gated with timing signals by gates 80 (FIG. 4c) and applied to six signalling circuits 81, 82, 83, 84, 85, 86, each signalling circuit being assigned to a respective one of the partial discharge paths.

Each signalling circuit 81-86 comprises a light emitting diode 87 which is lit to indicate a partial discharge in the assigned path. The appropriate decoded output, in the event of partial discharge, is gated by one of the gates 80 to trigger a display monostable 88 which activates the LED via an output buffer 91. The outputs of the gates 80 are also applied via inverters 89 to output terminals 90 for providing inputs to the recorder 42.

Three more outputs are provided by the output section according to the decoding of the pattern of stored signals. A set of EXCLUSIVE OR and OR gates 92 decode the contents of the latches 71-74 to determine whether a current pulse has been detected by each discharge detection unit. In the event that not all the discharge detection units have been triggered, indicating attenuation of a partial discharge pulse along the bus 10, this condition is decoded by the gates 92 and a display monostable 93 is triggered via a gate 94 which gates the decoded signal with a timing signal. The monostable activates a light emitting diode 95 through an output buffer 96, thus indicating the condition. A corresponding signal is applied via an inverter 97 to output terminal 97′, by which it is supplied to the recorder 42 so that the condition may be recorded.

Another output is the multiple partial discharge source (MCS) signal, which indicates false discharge signals from more than one source. For this purpose a set of gates 100 (FIG. 4b) are connected as a decoder to decode the contents of latches 71, 72, 73, 74 thereby providing an indication of whether two or three of the detected current pulses have polarities different from the rest. If such a condition arises, the gated output of decoder 100 triggers a display monostable 101, which activates a light emitting diode 102 through an output buffer 103 to signal the condition. A corresponding signal is supplied to the recorder 42 via an inverter 104 and output terminal 90″.

Finally, a noise output signal will appear on output terminal 90‴ to be recorded by the recorder 42, in the event that all detected pulses have the same polarity indicating a noise condition.

Figure 4A:
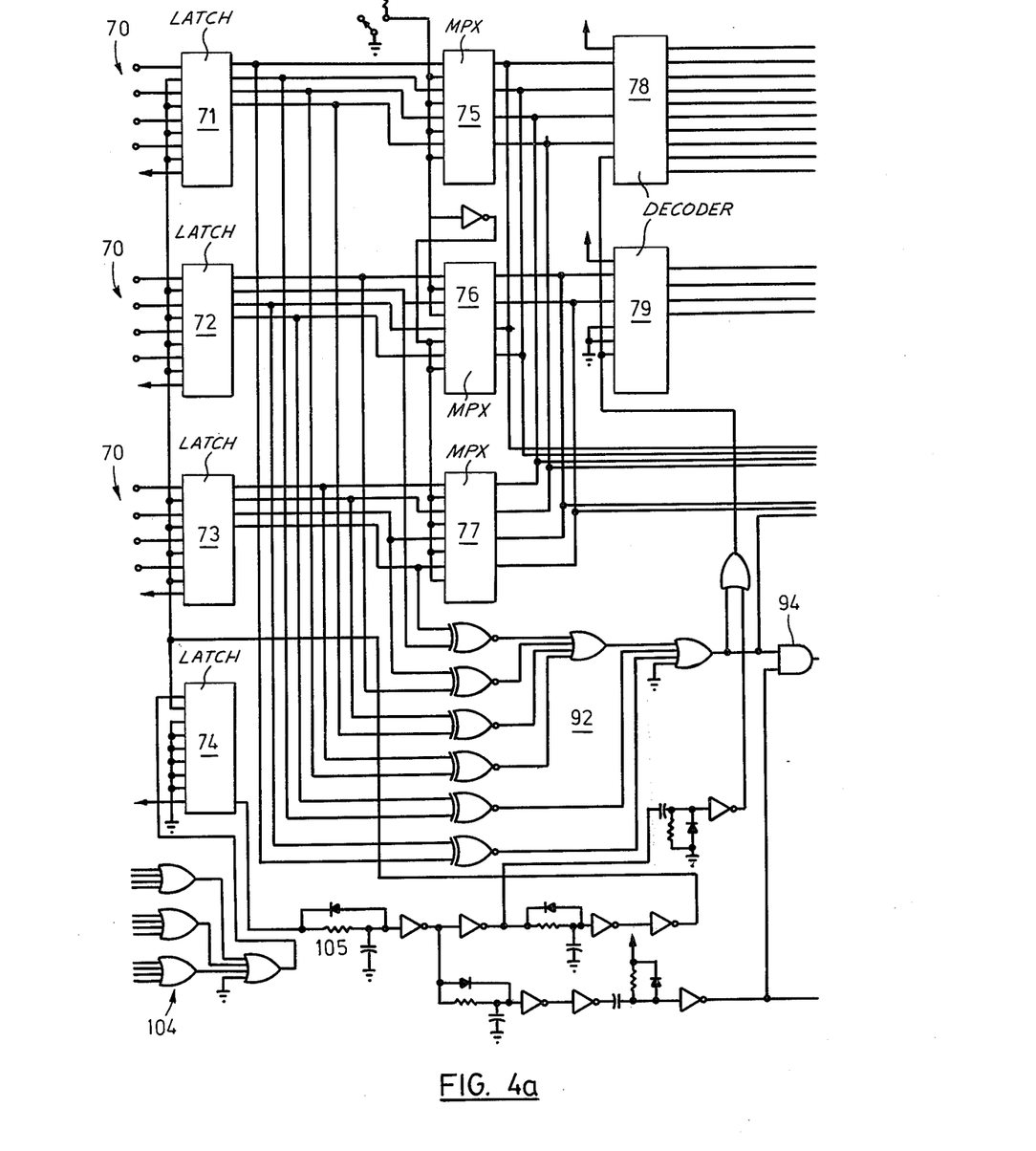
FIG. 4a, 4b and 4c together illustrate the decoding and output stages of the apparatus.
Figure 4B:
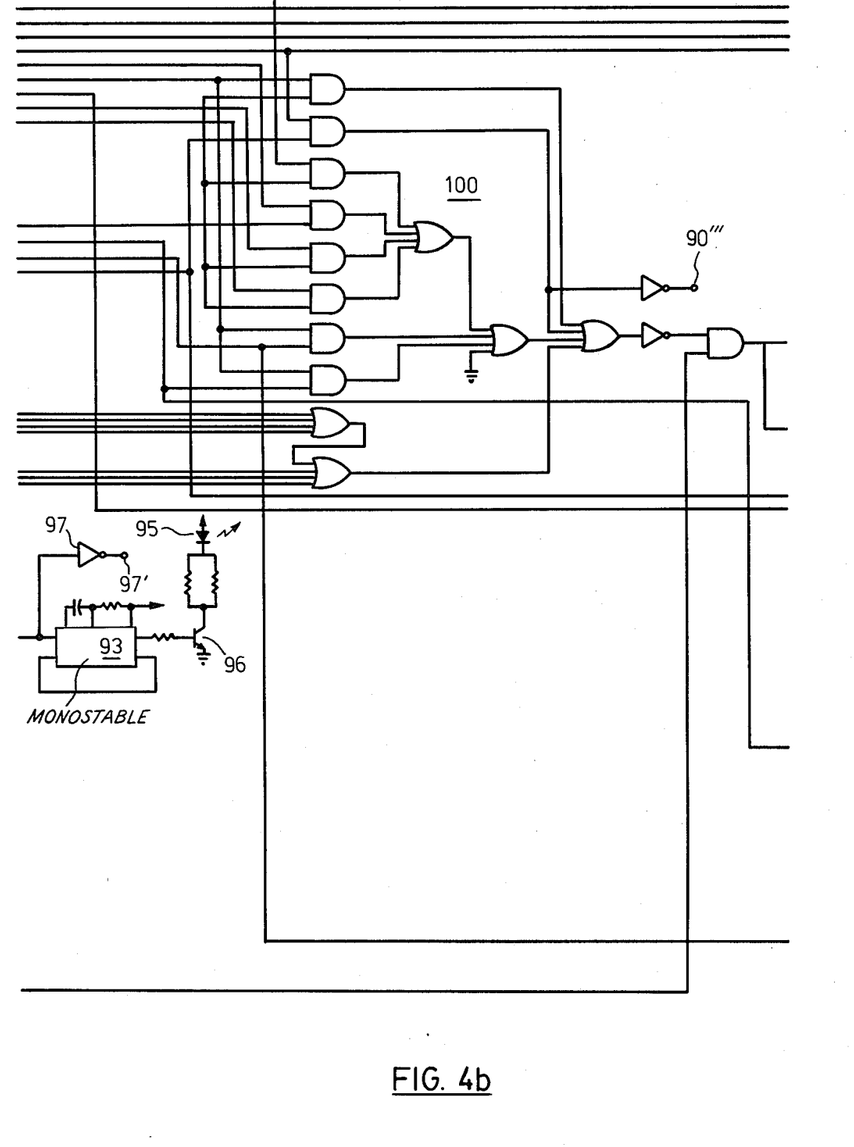
Figure 4C:
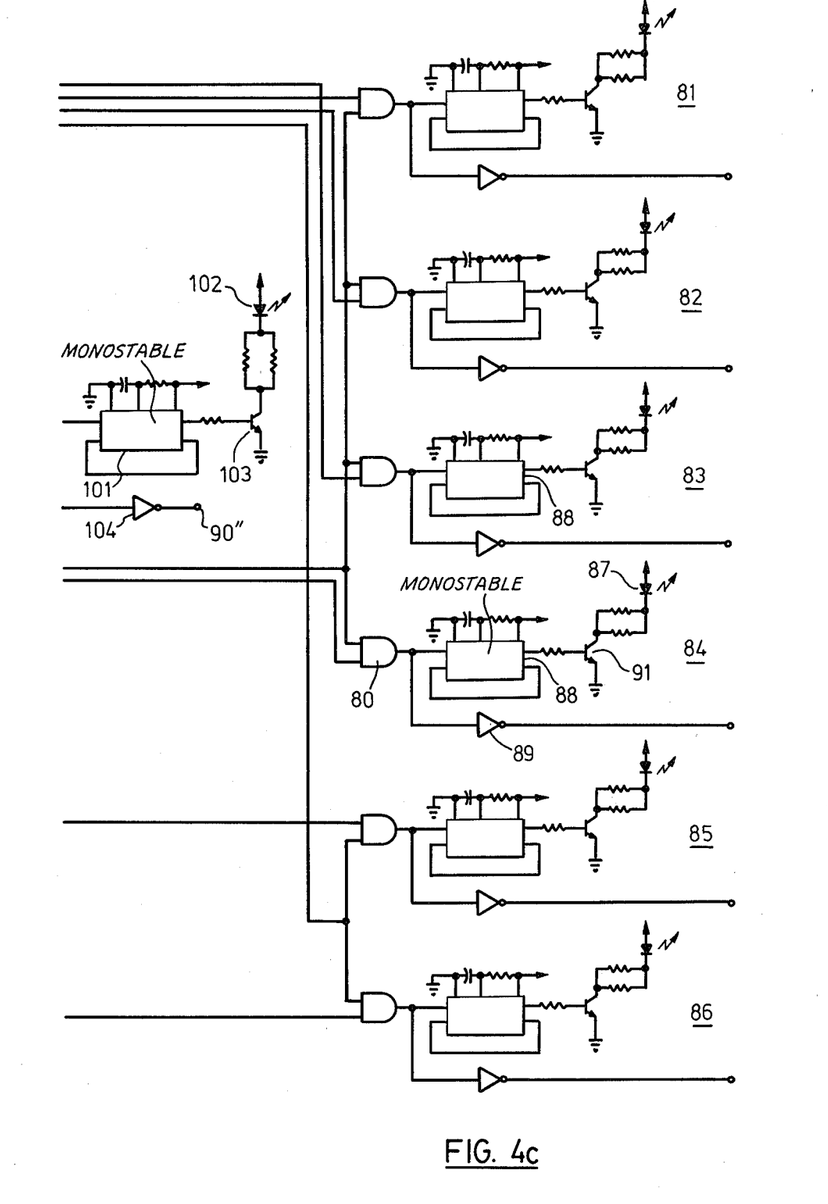

As indicated in FIG. 4a, timing of the various decoding circuits is initiated by a set of OR gates 104 having twelve inputs connected to the output terminals of the demultiplexer system 40 so that a pulse on any of those terminals will initiate the timing via latch 74 and a time delay circuit 105. Also shown in FIG. 4a is a polarity selector switch 106, the purpose of which is to select either the six "positive" outputs or the six "negative" outputs of the latches 71, 72 and 73 for further processing. The system could be adapted for simultaneous processing of all twelve latch outputs without the need for selection, but by providing the selector switch 106 the subsequent processing can be greatly simplified without loss of efficiency.

It is to be understood that the system described above is but one exemplary embodiment of the invention. Numerous modifications may be made without departing from the scope of the invention and, in particular, the logic circuitry by which the detected current pulses are noted, multiplexed, demultiplexed, decoded, and processed to activate appropriate indicators may be implemented in various ways as will be appreciated by the man skilled in the art.

What we claim is:

1. A fault anticipation system for monitoring partial discharge in high voltage electrical equipment providing a plurality of partial discharge paths wherein a detected current pulse may be indicative of partial discharge or a voltage transient, the system comprising:

a plurality of discharge detection units each including circuit means coupled to a respective one of said paths, said circuit means including a polarity detector responsive to the polarity of a detected current pulse and a multiplexer coupled thereto for producing an output signal coded according to the detected polarity, a plurality of demultiplexers each connected to a respective one of said multiplexers to receive the coded output signal therefrom, each demultiplexer having a first and a second channel which are activated selectively according to the coding of the received output signal, latching means having a plurality of latch inputs coupled to said demultiplexer channels for receiving and storing a pattern of signals corresponding to the selective activation of said demultiplexer channels, a decoding circuit coupled to said latching means for decoding the stored pattern of signals thereby to identify the pattern of polarities of detected current pulses, and signalling means responsive to said decoding circuit for signalling a condition in which the polarity of a current pulse detected in one said partial discharge path differs from the polarities of current pulses detected in all other said partial discharge paths.

2. A fault anticipation system according to claim 1, wherein said signalling means comprises a plurality of indicators each assigned to a respective one of said partial discharge paths, and circuit means responsive to said decoding circuit for selectively activating the indicators according to the identification of a partial discharge path in which the polarity of a detected current pulse differs from the polarities of the other detected current pulses.

3. A fault anticipation system according to claim 2, wherein the indicators are light emitting diodes.

4. A fault anticipation system according to claim 1, wherein the decoding circuit further comprises circuit means for decoding the stored pattern of signals thereby to identify a condition in which current pulses are identified in some but not all of said partial discharge paths, said signalling means further comprising indicator means responsive thereto for signalling such condition.

5. A fault anticipation system according to claim 1, wherein said circuit means of the discharge detection units are inductively coupled to said partial discharge paths.

6. A fault anticipation system according to claim 1, wherein each said multiplexer includes means for producing an output pulse, constituting said output signal, having a first or a second predetermined pulse width according to the polarity of the detected current pulse.

7. In combination with a high voltage substation equipment including solid-insulated components susceptible to partial discharge and providing a plurality of discrete partial discharge paths, fault anticipation apparatus for monitoring partial discharge indicative of impending electrical breakdown of one of said components, the apparatus comprising:

a plurality of current detection units, each unit being inductively coupled to a respective one of said paths and including a polarity detector responsive to the polarity of a detected current pulse and a multiplexer coupled thereto for producing an output pulse coded according to the detected polarity, a plurality of demultiplexers each connected to a respective one of said multiplexers to receive the coded output pulse therefrom, each demultiplexer including discriminating means for decoding said coded output pulse for producing a first or a second signal according to the detected polarity, latching means having a plurality of latch inputs coupled to the demultiplexers for receiving said first and second signals for storing a pattern of signals corresponding to the pattern of detected pulse polarities, decoding circuit means coupled to said latching means for decoding the stored pattern of signals, thereby to identify the pattern of polarities of detected current pulses, and signalling means responsive to said decoding circuit means for signalling said pattern of detected pulse polarities.

8. Fault anticipation apparatus according to claim 7, wherein said signalling means comprises a plurality of indicators each assigned to a respective one of said partial discharge paths, and circuit means responsive to said decoding circuit means for selectively activating the indicators according to the identification of a partial discharge path in which the polarity of a detected current pulse differs from the polarities of the other detected current pulses.

9. A fault anticipation apparatus according to claim 8, wherein the indicators are light emitting diodes.

10. A fault anticipation apparatus according to claim 9, wherein the decoding circuit further comprises circuit means for decoding the stored pattern of signals thereby to identify a condition in which current pulses are identified in some but not all of said partial discharge paths, said signalling means further comprising indicator means responsive thereto for signalling such condition.

11. A fault anticipation apparatus according to claim 7, wherein each current detection unit is inductively coupled to the respective discharge path by a high frequency current transformer having a split ferrite core.

12. A fault anticipation apparatus according to claim 7, wherein each current detection unit comprises a pair of operational amplifiers connected as a dual polarity comparator having a common input circuit connected to receive the detected current pulse, a pair of monostable multivibrators coupled to said amplifiers to be triggered thereby, said multivibrators having different time constants, circuit means responsive to triggering of each multivibrator to inhibit the other for a predetermined time, and circuit means interfacing the outputs of the multivibrators with a respective one of said demultiplexers.

13. A method of continuously monitoring partial discharge in high voltage electrical equipment providing a plurality of partial discharge current paths, which comprises detecting current pulses in each of said paths, determining the relative polarities of the detected current pulses, comparing the polarity of each detected current pulse with the remainder, identifying the respective partial discharge current path in the event of a discrepancy in such comparison and signalling the discrepancy.

* * * * *